(12) United States Patent
Motoshima et al.

(10) Patent No.: US 7,476,899 B2
(45) Date of Patent: Jan. 13, 2009

(54) ACTIVE MATRIX SUBSTRATE AND METHOD OF MANUFACTURING THE SAME

(75) Inventors: Hideto Motoshima, Kagoshima (JP); Masatoshi Tani, Kagoshima (JP); Shoichi Sonohata, Kagoshima (JP)

(73) Assignee: NEC LCD Technologies, Ltd., Kawasaki, Kangawa (JP)

( * ) Notice: Subject to any disclaimer, the term of this patent is extended or adjusted under 35 U.S.C. 154(b) by 0 days.

(21) Appl. No.: 11/127,135

(22) Filed: May 12, 2005

(65) Prior Publication Data

US 2005/0253150 A1    Nov. 17, 2005

(30) Foreign Application Priority Data

May 14, 2004    (JP)    ............................. 2004-144527

(51) Int. Cl.
*H01L 21/77* (2006.01)
*G02F 1/133* (2006.01)

(52) U.S. Cl. .......... 257/72; 257/E27.113; 257/E29.273; 349/152

(58) Field of Classification Search .................. 257/66, 257/72, E33.004, E29.273, E27.113; 349/149, 349/152
See application file for complete search history.

(56) References Cited

U.S. PATENT DOCUMENTS

| 6,038,003 | A * | 3/2000 | Kim | ............................. | 349/43 |
| 6,798,442 | B1 * | 9/2004 | Kim et al. | ....................... | 348/43 |
| 2002/0186330 | A1 * | 12/2002 | Kawasaki | ..................... | 349/43 |

FOREIGN PATENT DOCUMENTS

| JP | 2003-66474 | 3/2003 |
| KR | 1999-000915 | 1/1999 |

* cited by examiner

*Primary Examiner*—Lynne A. Gurley
*Assistant Examiner*—Colleen Matthews
(74) *Attorney, Agent, or Firm*—McGinn IP Law Group, PLLC

(57) ABSTRACT

Extraction wirings are respectively connected to a signal line of a switching element and a scanning line thereof, and led out to one side portion of a transparent insulating substrate. Conductive terminals respectively united with the extraction wiring are formed in tip end portions thereof, and a plurality of contact holes connected to the conductive terminals are formed on the conductive terminals so that a diver IC is mounted thereon by using conductive resin. Each of the extraction wirings is provided with a semiconductor film pattern in the vicinity of the contact hole for blocking the moisture in the conductive resin to reach the extraction wirings through an interlayer insulating film.

20 Claims, 15 Drawing Sheets

ACTIVE MATRIX SUBSTRATE AND METHOD OF MANUFACTURING THE SAME

BACKGROUND OF THE INVENTION

1. Field of the Invention

The present invention relates to an active matrix substrate and a method of manufacturing the same, and more particularly to an active matrix substrate used for a flat display panel such as a liquid crystal display (LCD) panel, and a method of manufacturing the same.

2. Description of the Related Art

An active matrix substrate for a flat display panel such as a liquid crystal display (LCD) panel is provided with a plurality of switching elements such as thin film transistors together with pixel electrodes arranged to form a matrix. Such active matrix substrate using thin film transistors is referred to as TFT substrate hereinafter. In a cellular phone market, a small-sized LCD panel such as two-inch-size panel with a TFT substrate is widely used. Although a reduction in size and weight of such a super twisted nematic (STN) type LCD panel with the TFT substrate has been realized, further reduction in cost and size are needed overwhelmingly. In Japanese Patent Application Laid-open No. 2003-066474, as shown in FIG. 4, scanning lines (gate wirings) 17 and signal lines (drain wirings) are formed on a TFT substrate 11 in a manner to intersect each other at right angles (not shown). To reduce the panel size, both terminal electrodes for gate wirings and drain wirings are arranged on the same side of the TFT substrate 11.

A signal line extraction wiring 2A and a scanning line extraction wiring 2B are thus arranged to electrically connect the terminal electrodes with the signal lines and the scanning lines located on a display area of the LCD panel, respectively. A scanning driver IC 13 for driving the scanning lines and a signal driver IC 14 for driving the signal lines are mounted on the terminal electrodes through contact holes 10, respectively. On the TFT substrate 11, a color filter (hereinafter referred to as CF) substrate 9 is located so as to be opposite to the TFT substrate 11. A liquid crystal layer (not shown) is interposed between these substrates, thus constituting a liquid crystal display (LCD) panel 200.

A conventional LCD panel has a terminal structure as shown in FIG. 3, wherein a first interlayer insulating film 3 and a second interlayer insulting film 4 are formed on the extraction wiring 2. Referring to FIG. 1, which is a cross sectional view of FIG. 4 in the vicinity of an end portion of the extraction wiring 2, voids 16 tend to be generated in the first interlayer insulating film 3, though an amount of the generation is small. These voids may reach the surface of the second interlayer insulating film 4. Since a step coverage in an edge of the extraction wiring portion of the first interlayer insulating film 3 is poor, the voids tend to be generated. When the voids are generated in the first insulating film 3, the voids grow into the second interlayer insulating film 4, and reach the surface of the second interlayer insulating film 4.

In the conventional LCD panel as shown in FIG. 4, the scanning driver IC 13 and the signal driver IC 14 are separately used. For driving the LCD panel, as shown in FIG. 2, a gate voltage 18 of about 10 to 20 V is applied to a selected scanning line through the scanning driver IC 13 for about 20 μsec as a turn-on voltage or a writing voltage for the TFT, and a storage voltage or a retention voltage of about −20 to −10 V is applied for 15000 to 20000 μsec. A base voltage of the driving driver IC 13 is always maintained at the retention voltage. Furthermore, signal lines are applied with alternate voltage of about −3 to +3 V through the signal driver IC 14 as a drain voltage to prevent image persistence in the LCD.

It may be possible to integrate two diver ICs 13 and 14 into a single driver IC to reduce an area occupied for mounting the driver ICs and to achieve a cost reduction. However, in integrating the signal line driver IC and the scanning driver IC to a single driver IC, the voltages are applied to the signal line and the scanning line with one driver IC, and thus the base voltage of the driver IC is maintained at the voltage for the signal line. Furthermore, as shown in FIG. 3, for mounting the driver IC 7 on the TFT substrate, the conductive resin 6 such as an anisotropic conductive film (ACF) is used. The conductive resin 6 is not heated directly, but only the driver IC 7 is heated. The conductive resin 6 absorbs moisture thereinto because of its material nature. When the conductive resin 6 is not heated fully, the moisture remains therein. Since the driver IC 7 is superposed on and joined to the TFT substrate to be electrically connected to the terminal electrodes through the contact holes 10 with ITO film 5, the conductive resin 6 has a positional relation in which the conductive resin 6 protrudes from the driver IC 7, and an amount of remaining moisture in the conductive resin 6 becomes larger as the conductive resin 6 becomes further away out of alignment.

Because of the foregoing conditions, the gate wiring side serving as the scanning line takes a minus potential which is a base potential, as shown in FIG. 3. Since the moisture exists in the conductive resin 6, the moisture reaches the surface of the extraction wiring 2 through the voids in the first and second interlayer insulating films 3 and 4. Then, there has been a problem that the extraction wiring 2 is hydrated by hydroxide ions (OH−) generated through dissociation of the moisture, and causes a electrical disconnection.

SUMMARY OF THE INVENTION

Accordingly, the present invention has a feature in that adopting of an active matrix substrate is capable of eliminating the problem where the extraction wiring of the LCD panel is disappeared due to the hydration thereof, the foregoing conventional signal line driver IC and the foregoing conventional scanning line driver IC having been integrated, and a method of manufacturing the same is provided.

The active matrix substrate of the present invention includes a switching element for a LCD panel on a transparent insulating substrate, and extraction wirings connected to a signal line of a switching element and a scanning line thereof are led out to one side portion on the transparent insulating substrate. The active matrix substrate includes a conductive terminal integral with the extraction wirings in a leading end portion of the extraction wiring, and a plurality of contact holes on the conductive terminal, which are connected to the conductive terminal. The contact holes are connected to a driving device for driving the signal line and the scanning line through conductive resin. On each of the extraction wirings in the vicinities of the contact holes, a semiconductor pattern is formed via a first insulating film.

As the transparent substrate of the active matrix substrate according to the present invention, one can be used, which is selected among a glass substrate, a plastic substrate, and a substrate obtained by adhering the glass substrate and the plastic substrate. Furthermore, it is possible to adopt an independent pattern covering each of the extraction wirings or a linear pattern intersecting the whole of the extraction wirings.

The semiconductor pattern of the active matrix substrate according to the present invention can use the same material as that of the semiconductor layer of the switching element, and can be patterned simultaneously with formation of the semiconductor layer of the switching element. As a material of the semiconductor pattern, amorphous silicon can be used.

In the active matrix substrate according to the present invention, the foregoing switching element can be formed by a channel etching type process.

A method of manufacturing an active matrix substrate, includes: forming a first conductive film on a transparent insulating substrate; patterning the first conductive film, thus allowing the first conductive film to extend to a gate wiring of a switching element and one side portion of the transparent insulating substrate, and forming a scanning line extraction wiring of a switching element and a signal line extraction wiring thereof simultaneously, each of the scanning line extraction wiring and the signal line extraction wiring having a terminal portion in a tip end thereof; forming a first interlayer insulating film on the transparent insulating substrate; forming a semiconductor film on the first interlayer insulating film; patterning the semiconductor film to form a semiconductor film of the switching element and a semiconductor film pattern covering the scanning line extraction wiring and the signal line extraction wiring in the vicinity of the terminal portion simultaneously; forming a second conductive film on the entire surface of the transparent insulating substrate; and patterning the second conductive film to form a drain wiring of the switching element, a source electrode thereof and a drain electrode thereof simultaneously.

In the method of manufacturing the active matrix substrate according to the present invention, after forming the drain wiring, the source electrode and the drain electrode simultaneously, the method further includes: forming an opening reaching from a surface of the second interlayer insulating film on the terminal portion to the terminal portion after forming a second interlayer insulating film on the entire surface of the transparent insulating film; and covering the opening with a transparent conductive oxide film and forming a contact hole.

In the method of manufacturing the active matrix substrate according to the present invention, forming the semiconductor film on the first interlayer insulating film includes forming an amorphous silicon film and an n-type amorphous silicon film continuously, and the n-type amorphous silicon film of the switching element is removed by etching, after forming the drain wiring, the source electrode and the drain electrode simultaneously.

In the active matrix substrate according to the present invention, the semiconductor pattern covering the signal line extraction wiring and the scanning line extraction wiring, which are led out to one side portion of the active matrix substrate, is formed simultaneously with formation of the semiconductor layer of the switching element, which is made of the same material as that of the semiconductor pattern. By this semiconductor pattern, it is possible to increase reliability of the LCD panel with respect to moisture, which mounts a driving device for both of the signal line and the scanning line on the terminal portion of the extraction wiring by use of anisotropic conductive resin. This is because it is possible to suppress influences of voids the interlayer insulating film (first interlayer insulating film) just above the extraction wiring by the semiconductor pattern on the extraction wiring in the vicinity of the terminal portion. Specifically, entering of moisture contained in the anisotropic resin to the first interlayer insulating film is blocked by the semiconductor film pattern, and a hydration reaction of the extraction wiring can be suppressed.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

Figure 1:
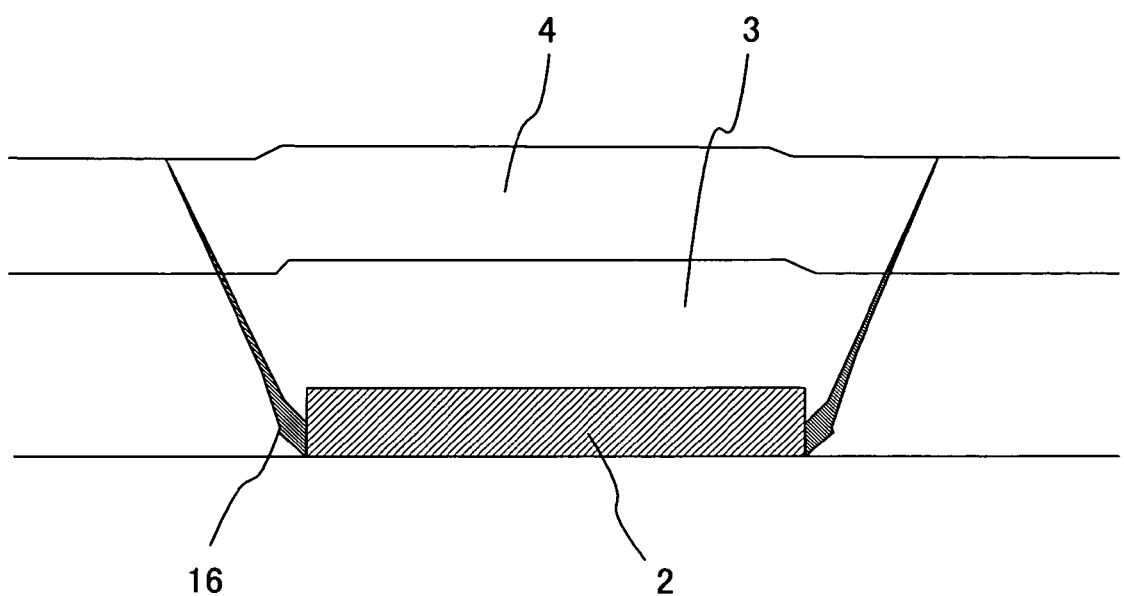
FIG. 1 is a section view showing a structural example of an extraction wiring portion of a conventional LCD panel.
Figure 2:
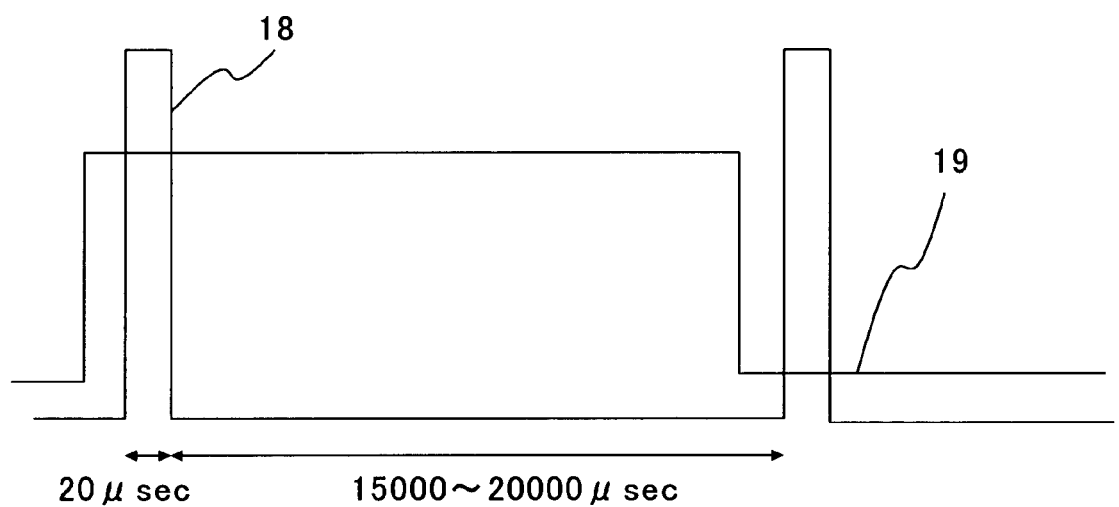
FIG. 2 is a diagram showing voltage application conditions for a signal driver IC and a scanning driver IC in a LCD panel using a conventional TFT substrate.
Figure 3:
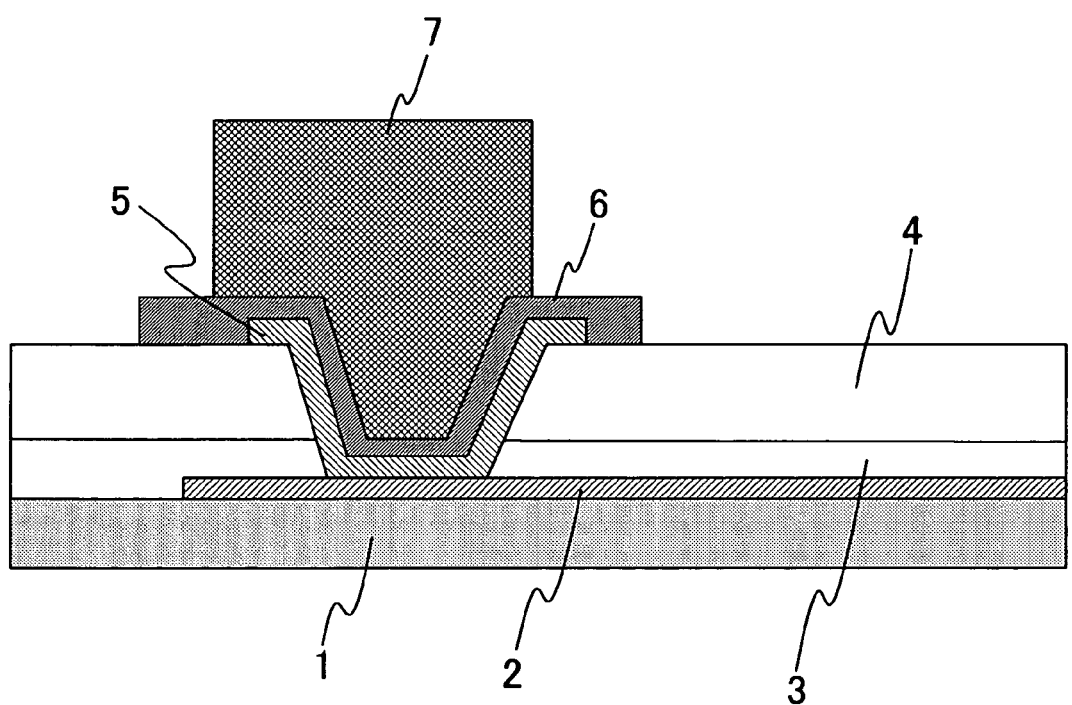
FIG. 3 is a schematic view for explaining a mechanism in which an extraction wiring is hydrated in the conventional TFT substrate.
Figure 4:
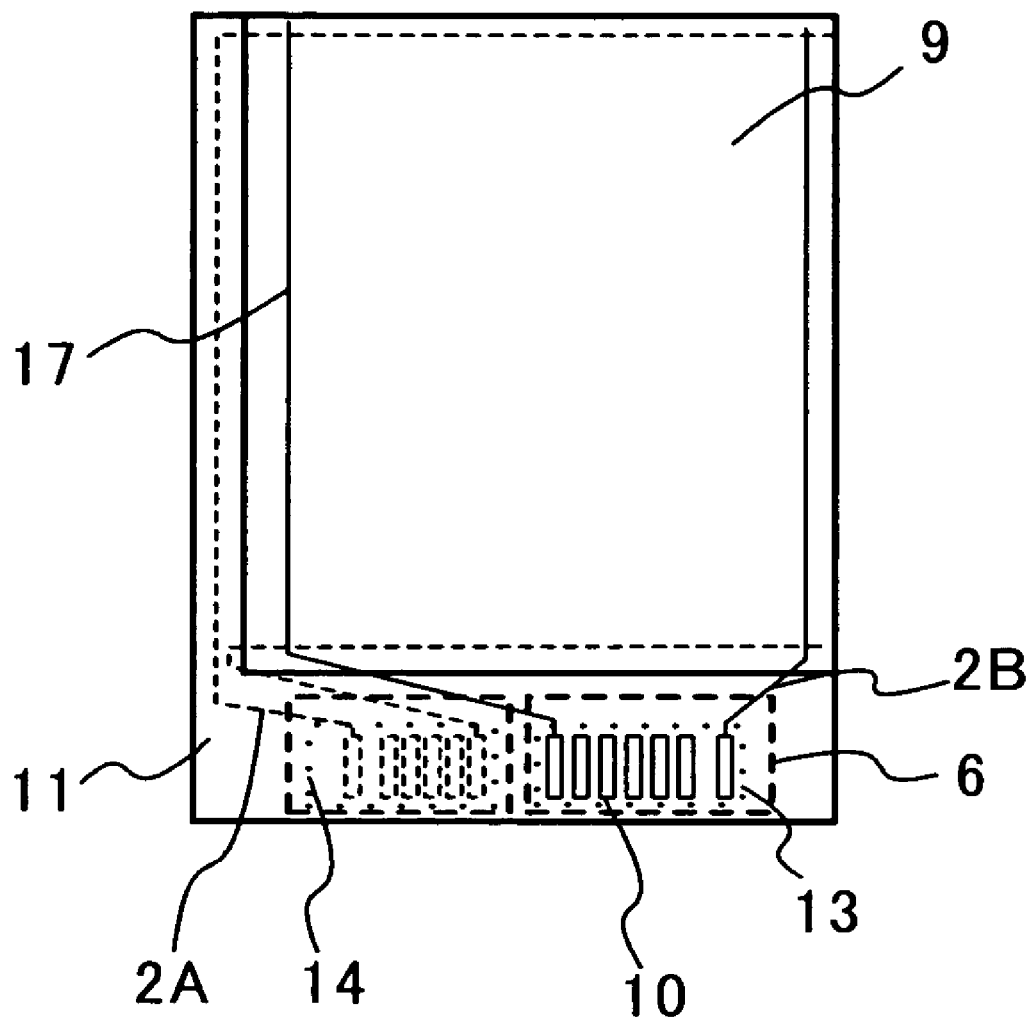
FIG. 4 is a plan view showing an example of a convention LCD panel.
Figure 5:
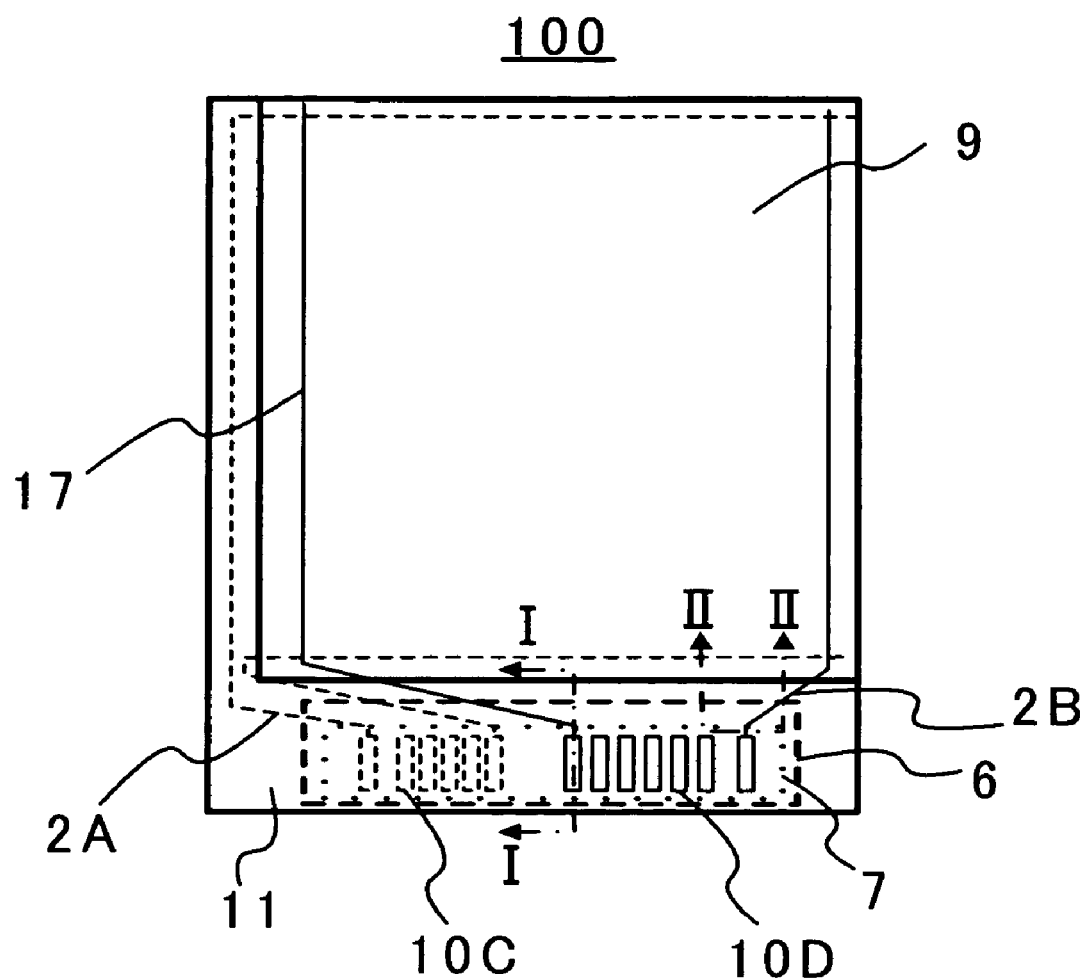
FIG. 5 is a plan view showing an example of a LCD panel in which a CF substrate is jointed to a TFT substrate of an exemplary embodiment of the present invention.

Referring to FIG. 5, a signal line extraction wiring 2A and a scanning line extraction wiring 2B are led out to one side portion of a TFT substrate 11. These extraction wirings are electrically connected to terminal electrodes via contact holes 10C and 10D, respectively. In the TFT substrate 11 of the exemplary embodiment of the present invention, the scanning lines and the signal lines are driven by a single drive device such as a monolithic driver IC 7. The driver IC 7 for driving both scanning lines and signal lines is mounted on the ITO film of the contact holes 10C and 10D of the respective extraction wirings with a conductive resin 6 interposed therebetween. A CF substrate 9 is located on the TFT substrate 11 so as to be opposite to each other. A liquid crystal layer (not shown) is disposed between these substrates to constitute a LCD panel 100. Note that the positions of the signal line extraction wiring 2A and the scanning line extraction wiring 2B shown in FIG. 5 may be switched to each other.

Figure 6:
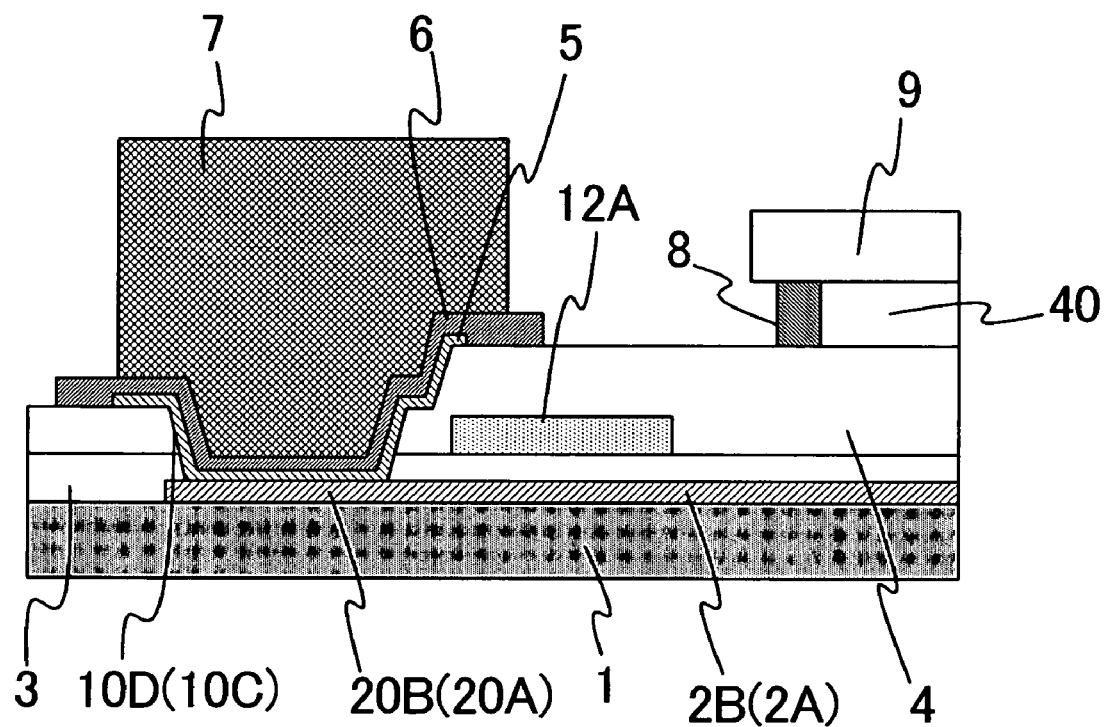
FIG. 6 is a section view taken along the line I-I of FIG. 5.

In FIGS. 6 and 7, section views taken along the lines I-I and II-II of FIG. 5 are respectively shown. Referring to FIG. 6, the scanning line extraction wiring 2B and the signal line extraction wiring 2A are formed on the transparent insulating substrate 1, and a first-layered interlayer insulating film 3 and a second-layered interlayer insulating film 4 are formed on the extraction wirings 2B and 2A. An Indium Tin Oxide (ITO) film 5 is formed on an opening formed in these interlayer insulating films to provide a contact holes 10D and 10C which are electrically connected to the scanning line extraction wirings 2B and 2A, respectively. The driver IC 7 for driving a signal line and a scanning line is mounted via the conductive resin 6. On the extraction wirings 2B and 2A in the vicinity of the contact holes 10D and 10C, a pattern of a semiconductor film (a-Si 12A) is formed. The pattern of the semiconductor film is also formed on the TFT forming regions. As an example of the transparent insulating substrate 1, a glass substrate, a transparent plastic substrate such as acrylic resin, a laminated substrate of the glass substrate and the plastic substrate are jointed, and the like can be used.

Anisotropic conductive resin (ACF) is used for the conductive resin 6. As an example of a material of the extraction wiring, Cr, Al, Mo, Ti, and a film made of alloy of these metals can be used. As a material of the first and second interlayer insulating films 3 and 4, a $SiN_x$ film can be used. The semiconductor film 12 is made of a lamination film formed of amorphous silicon (hereinafter referred to as a-Si) film and an n-type amorphous silicon (hereinafter referred to as n-type a-Si) film. The semiconductor film 12 can be formed simultaneously with the formation of the semiconductor film pattern of the TFT, in such a manner that the semiconductor film is left on the extract ion wiring without etching this semiconductor film at the time of the formation of the semiconductor film pattern of the TFT.

Figure 7A:
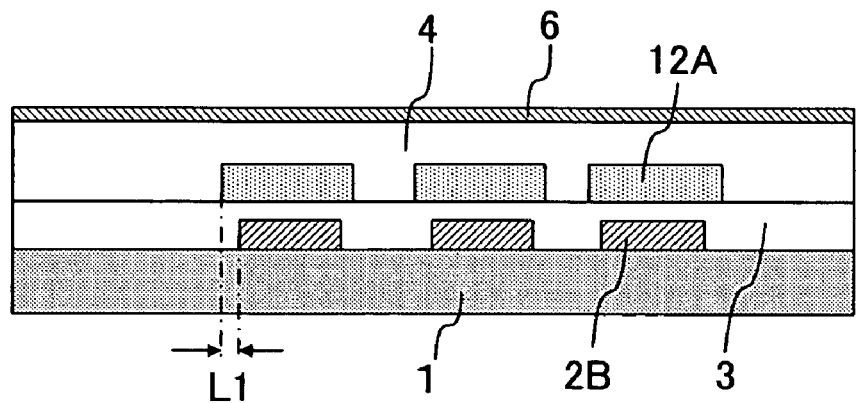
FIGS. 7A and 7B are section views taken along the line II-II of FIG. 5.
Figure 7B:
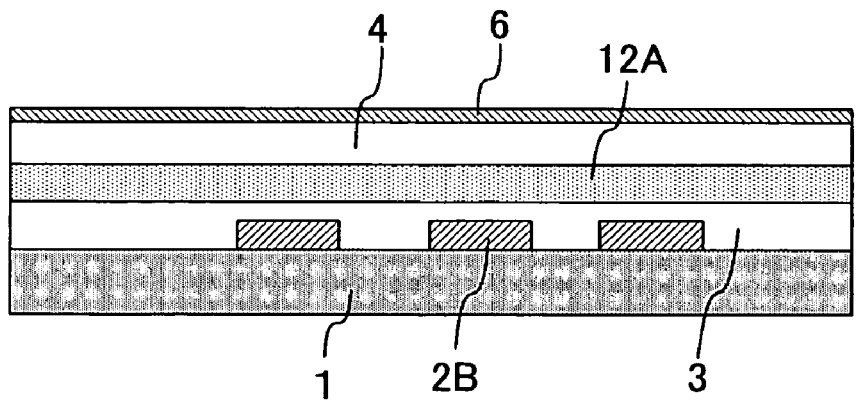

The semiconductor film (a-Si film 12A) can be provided to cover the extraction wirings 2A and 2B as an independent pattern as shown in FIG. 7A, or alternatively can be provided as a linear pattern so that the semiconductor film (a-Si film 12A) strides across all of the extraction wirings 2A and 2B as shown in FIG. 7B. When the semiconductor film is provided as the linear pattern, the semiconductor films may be provided separately so that the semiconductor films stride respectively across the scanning line extraction wirings 2B and the signal line extraction wirings 2A, or may be provided as a linear pattern which strides wholly across the scanning line extraction wirings 2B and the signal line extraction, wirings 2A. In the case of FIG. 7A, the length L1 by which the pattern of the semiconductor film (a-Si film 12A) protrudes from the side edge of the scanning line extraction wiring 2B is required to be 2 μm or more. This is because though the precision in superposing the upper-layered film on the extraction wiring depends on a precision of an aligner, the precision is generally 1.5 μm. Though the length of the void (see reference numeral 16 in FIG. 15) in the interlayer insulating film extending from the extraction film depends on the thickness of the inter layer insulating film, the length of the void is estimated to be (film thickness of the first interlayer insulating film 3)×1/(cos 45°) In general, the thickness of all of the interlayer insulating films needs to be 2 μm or more. In this value of the thickness, the thickness of the first interlayer insulating film, which ranges from 0.3 to 0.5 μm, is included.

FIG. 7B is a case in which as the interlayer film, the extraction wiring is left on the entire surface. Also in this case, in the extraction wiring located outermost, the semiconductor film needs to protrude on its one end by 2.0 μm or more.

The CF substrate 9 is fixed to the TFT substrate 11 via a seal member 8. A liquid crystal layer 40 is inserted between these substrates, and thus the LCD panel is constituted.

Figure 8:
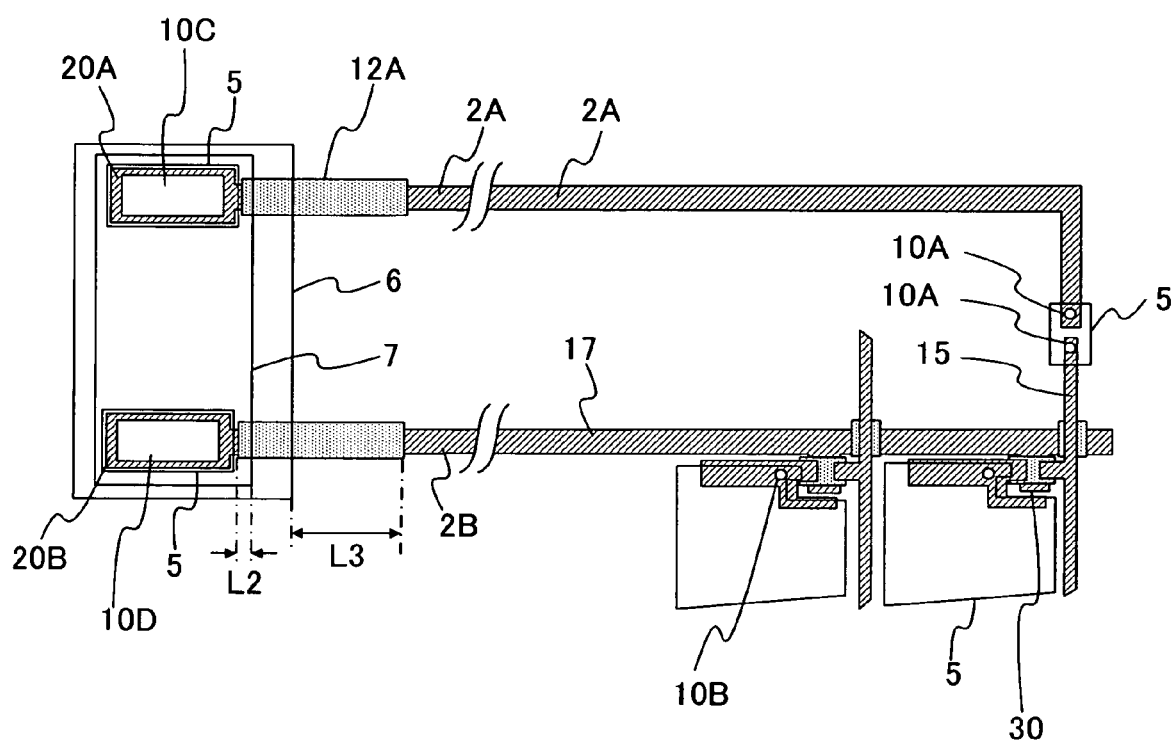
FIG. 8 is a plan view showing an example of a positional relation between an extraction wiring and a driver IC of the TFT substrate of the exemplary embodiment of the present invention.

FIG. 8 is a plan view showing an example of a positional relation between the extraction wiring and the driver IC of the TFT substrate of the exemplary embodiment according to the present invention. Referring to FIG. 8, a gate wiring 17 (scanning line) of a TFT 30 extends to the periphery of the TFT substrate, and serves as the scanning line extraction wiring 2B at the outside of a display area surrounded by a sealing member 8. A terminal electrode 20B is formed in the tip end of the scanning line extraction wiring 2B. The terminal 20B is connected to a conductive film 5 such as the ITO film 5 of the contact hole 10D to which the driver IC 7 is connected. A drain wiring 15 (signal line) of the TFT 30 is electrically connected to the signal line extraction wiring 2A via the conductive film 5 such as the ITO film 5 of the contact hole 10A. A terminal 20A is formed in the tip end of the signal line extraction wiring 2A, and the terminal 20A is connected to the ITO film 5 of the contact hole 10C to which the driver IC 7 is connected.

The pattern of the semiconductor film (a-Si film 12A) overlaps or covers the signal line extraction wiring 2A and the scanning line extraction wiring 2B in the vicinities of the contact holes 10D and 10C with the first interlayer insulating film 3 interposed therebetween (not shown in FIG. 8). The width with which the pattern of the semiconductor film (a-Si film 12A) covers the signal line extraction wiring 2A and the scanning line extraction wiring 2B is set to a value so that the semiconductor film protrudes from the side edge of each of the signal line extraction wiring 2A and the scanning line extraction wiring 2B by 2 μm or more, which is equal to the above-stated width L1. With respect to the length with which the conductive resin 12 covers the wiring in a longitudinal direction of the wiring, the inequalities L2≧30 μm and L3≧1500 μm are established, where L2 is a distance between the periphery of the driver IC 7 and the inner end of the semiconductor film, and L3 is a distance between the periphery of the conductive resin 6 and the outer end of the semiconductor film. By controlling the lengths L1, L2 and L3 to the foregoing range, it was found that disappearing of the extraction wiring due to the moisture of the conductive resin 6 and the voltage application is prevented. Note that in FIG. 8, the conductive resin 6 is formed so as to be wider than the driver IC 7 by about 2 to 2.5 mm considering an alignment precision.

Next, a method of manufacturing the TFT substrate of this exemplary embodiment according to the present invention will be described with reference to FIGS. 9B through 13B showing the manufacturing steps. FIGS. 9A, 10A, 11A, 12A, 13A and 14A are section views of the TFT substrate in the contact hole formation region mounting the driver IC, and FIGS. 9B, 10B, 11B, 12B and 13B are plan views showing formation states of the drain wiring, the gate wiring and the extraction wiring, which are led out from the TFT.

Figure 9A:
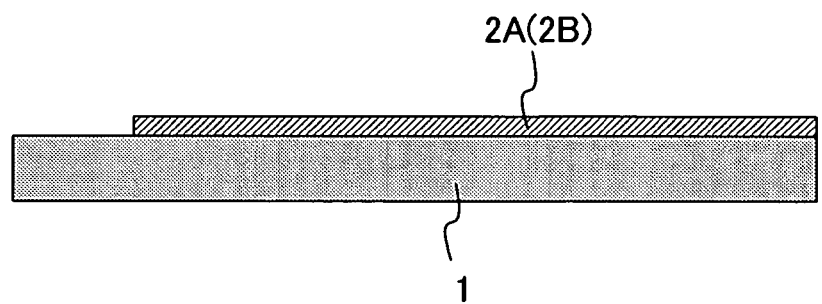
FIG. 9A is a section view of a contact hole formation region mounting a driver IC for explaining manufacturing steps of the TFT substrate of the embodiment of the present invention.
Figure 9B:
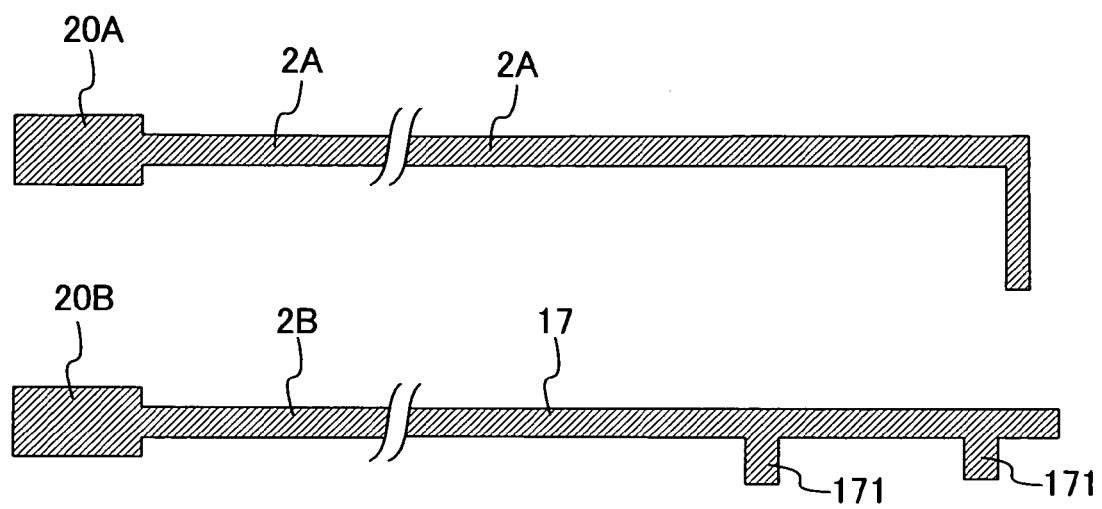
FIG. 9B is a plan view showing a formation state of a drain wiring and a gate wiring, which are led out from the TFT, and an extraction wiring for explaining the manufacturing steps of the TFT substrate of the embodiment of the present invention.

First, a thin film for a first wiring made of a metal selected among Cr, Al, Mo, Ti and an alloy film made of at least one of these metals is formed on the transparent insulating substrate 1 such as a glass substrate. Subsequently, by use of a photolithography technique used in a semiconductor technology, the gate wiring 17, the signal line extraction wiring 2A and the scanning line extraction wiring 2B are formed simultaneously as shown in FIG. 9B. In the tip end of each of the extraction wirings, the terminals 20A and 20B are also patterned simultaneously with the patterning of the extraction wirings.

Next, a first interlayer insulating film 3 such as a $SiN_x$ film is formed on the transparent insulating film 1 for coating all the wirings. Further, on the first interlayer insulating film 3, an a-Si film and an n-type a-Si film are continuously formed.

Figure 10A:
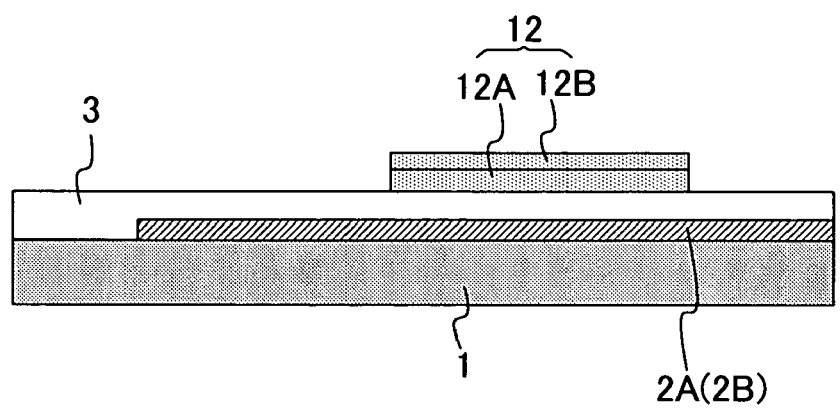
FIG. 10A is a section view of the contact hole formation region mounting the driver IC for explaining steps subsequent to the step of FIG. 9A.
Figure 10B:
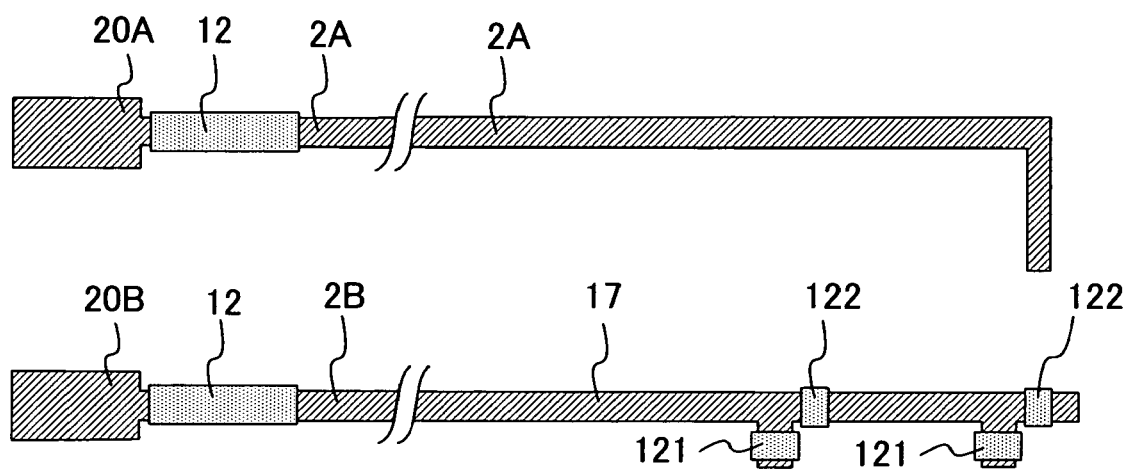
FIG. 10B is a plan view showing a formation state of the drain wiring and the gate wiring, which are led out from the TFT, and the extraction wiring for explaining the step subsequent to the step of FIG. 9B.

Next, the semiconductor film composed of the a-Si film and the n-type a-Si film is patterned as shown in FIGS. 10A and 10B. Reference numeral 12 denotes the semiconductor film formed by the lamination film composed of the a-Si film 12A and the n-type a-Si film 12B. The elongated square pattern of the semiconductor film 12 is formed on the first interlayer insulating film 3 to selectively cover the extraction wirings 2A and 2B in the vicinities of the terminals 20A and 20B, and on the gate electrode 171 as denoted by reference numerals 121. The pattern of the semiconductor film 122 is also formed on the gate wiring 17 where the drain wiring intersects. The dimension of the pattern of the semiconductor film 12 on the extraction wirings 2A and 2B in the vicinity of the terminals 20A and 20B is determined so that the values of L1 to L3 described in the explanations with reference to FIG. 7 and FIG. 8 are satisfied.

Figure 11A:
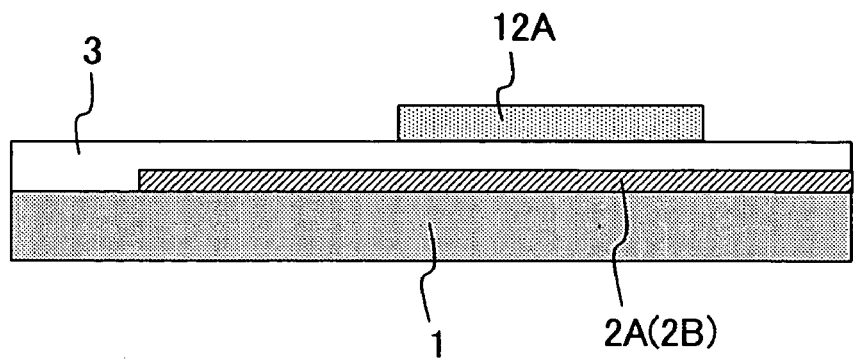
FIG. 11A is a section view of the contact hole formation region mounting the driver IC for explaining a step subsequent to the step of FIG. 10A.
Figure 11B:
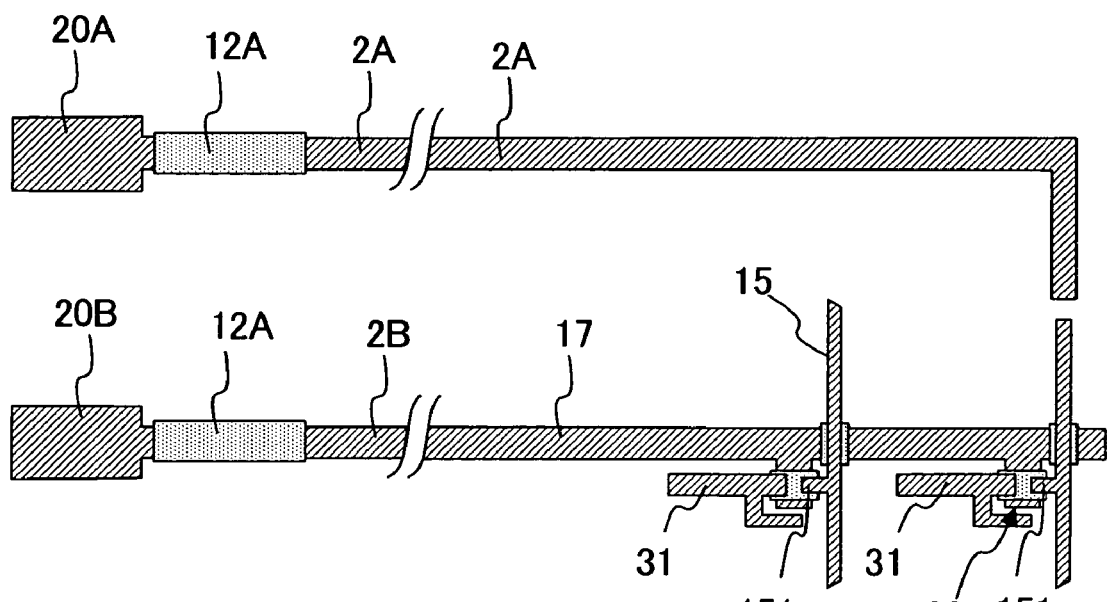
FIG. 11B is a plan view showing a formation state of the drain wiring and the gate wiring, which are led out from the TFT, and the extraction wiring for explaining the step subsequent to the step of FIG. 10B.

Subsequently, a thin film made of a metal selected among Cr, Al, Mo, Ti and an alloy film for a second wiring made of at least one of these metals is formed on the entire surface of the resultant structure. This film is patterned as shown in FIG. 11B, to provide the drain wiring 15 together with source electrodes 31 and drain electrodes 151.

Next, by use of dry-etching or the like, n-type a-Si film 12B is removed except for the region coated with the source electrode 31, drain electrode 151 and drain wiring 15 in the TFT 30. The resulting TFT is a channel etch type TFT, and that the TFT portion is formed after five photoprocesses (PR) Needless to say, the remaining n-type a-Si film 12B serves as an ohmic contact layers.

Figure 12A:
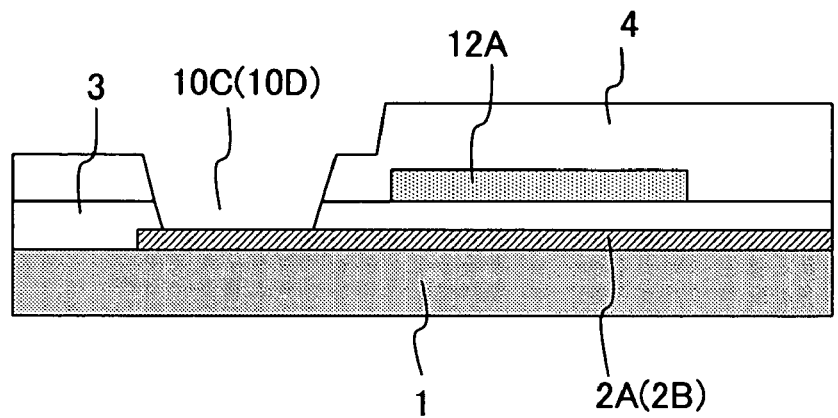
FIG. 12A is a section view of the contact hole formation region mounting the driver IC for explaining a step subsequent to the step of FIG. 10A.
Figure 12B:
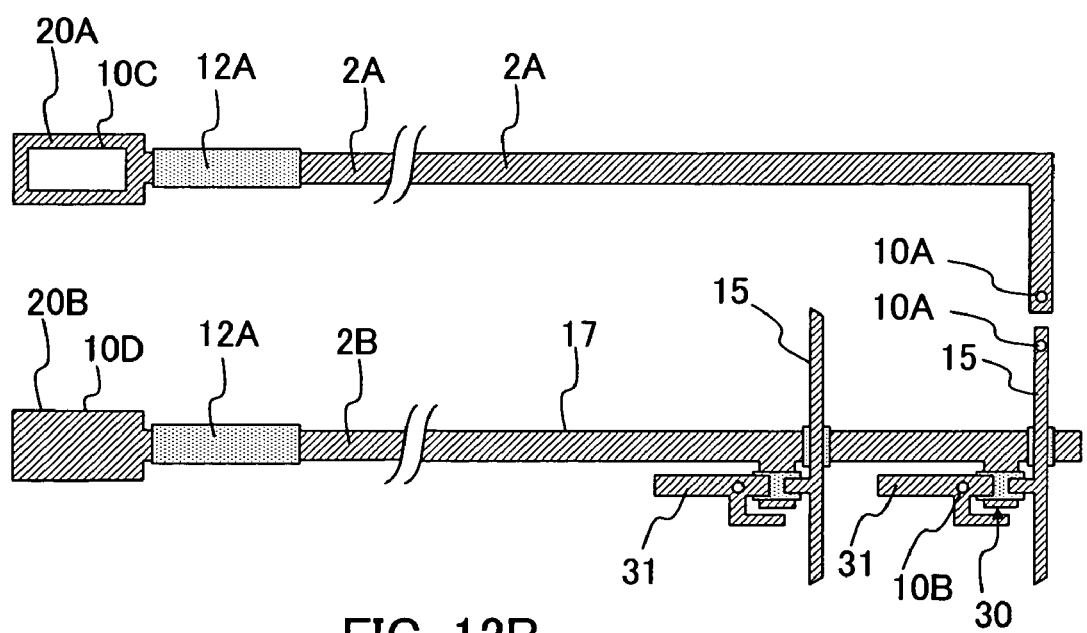
FIG. 12B is a plan view showing a formation state of the drain wiring and the gate wiring, which are led out from the TFT, and the extraction wiring for explaining the step subsequent to the step of FIG. 10B.

Next, the second insulating film 4 such as a $SiN_x$ film is formed on the first interlayer insulating film 3 so as to coat the transparent insulating substrate 1. As shown in FIGS. 12A and 12B, in the first and second interlayer insulating films 3 and 4, the contact holes 10C and 10D for mounting the driver IC 7 with the terminals are formed. In the first and second interlayer insulating films 3 and 4, the contact holes 10A and 10B are simultaneously formed. The contact holes 10A are provided for connecting the drain electrode 15 in the display area of the TFT substrate and the signal line extraction wiring 2A outside of the display area. The contact holes 10B are provided for connecting between pixel electrode such as ITO film and the source electrode 31 of the TFT.

Figure 13A:
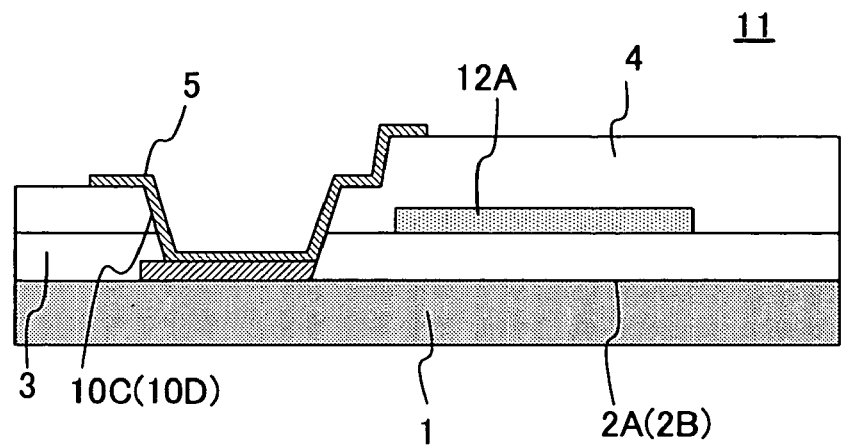
FIG. 13A is a section view of the contact hole formation region mounting the driver IC for explaining a step subsequent to the step of FIG. 12A.
Figure 13B:
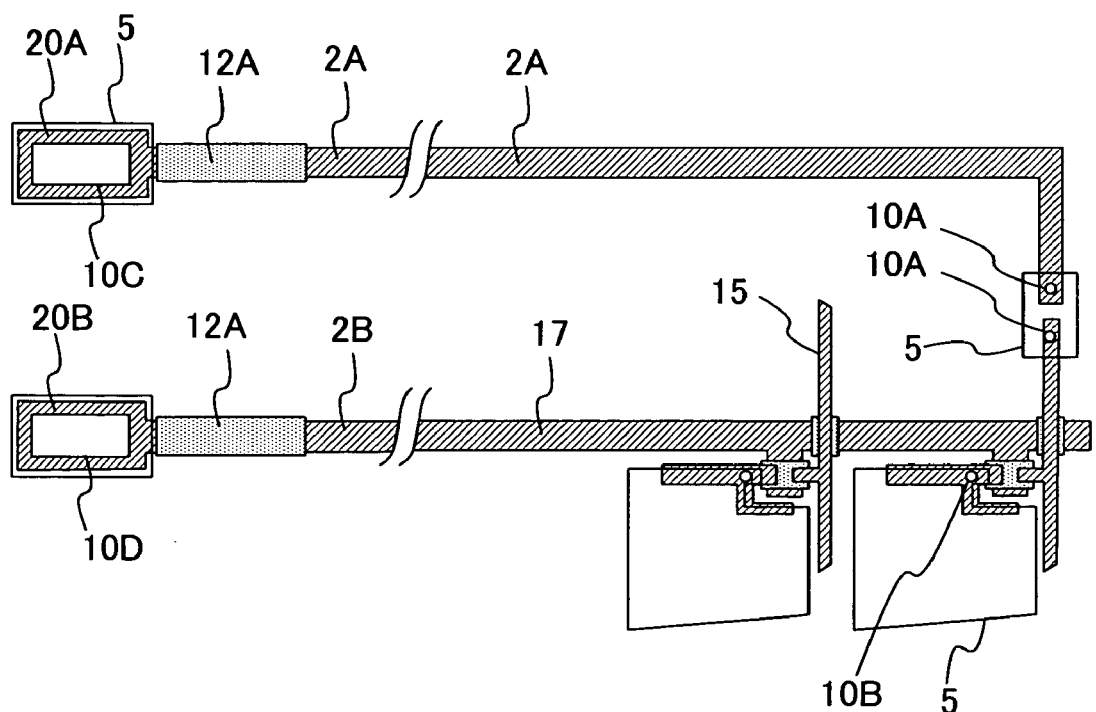
FIG. 13B is a plan view showing a formation state of the drain wiring and the gate wiring, which are led out from the TFT, and the extraction wiring for explaining the step subsequent to the step of FIG. 12B.
Figure 14:
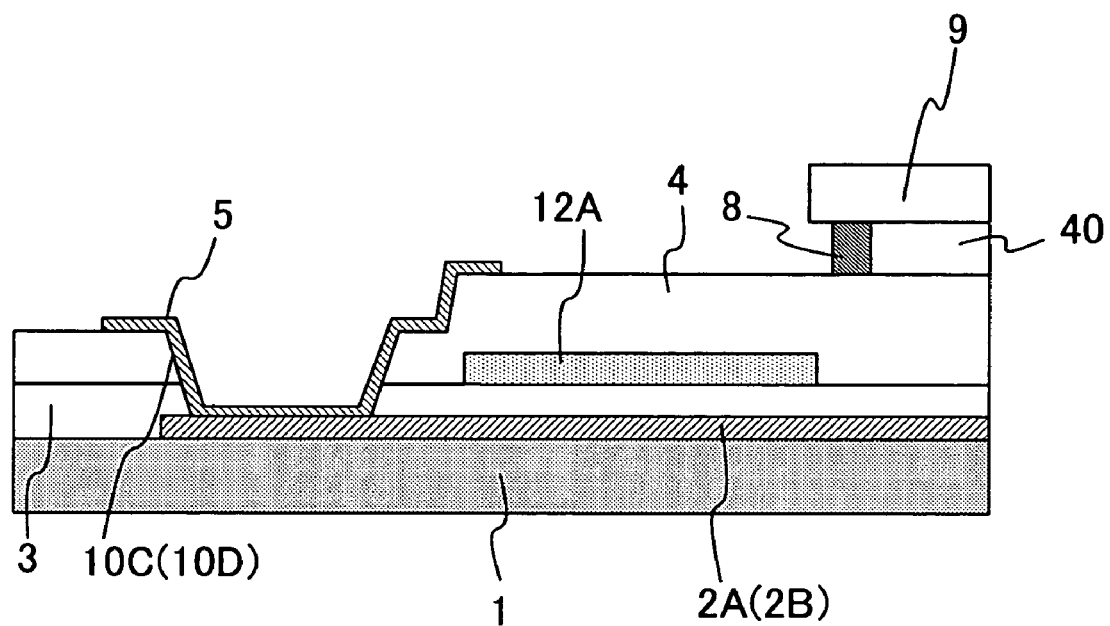
FIG. 14 is a section view showing an example of a LCD panel using the TFT substrate of the present invention.

Next, as shown in FIGS. 13A and 13B, the ITO (Indium Tin Oxide) film 5 which is a transparent electrode is formed on the entire surface of the glass substrate 1. This film is patterned so as to be left in each of the contact holes 10A, 10B, 10C and 10D. The ITO films 5 at the contact holes 10A 10C and 10D serves as an electrical conductive through-holes while the ITO film 5 at the hole 10B serves as transparent pixel electrodes.

The above described matters are the method of manufacturing the TFT substrate.

Next, an alignment film made of polyimide resin or the like is coated onto the TFT substrate and the CF substrate 9, and a rubbing treatment is performed. Thereafter, both substrates are jointed with resin called a seal member 8, which is thermally hardened. A liquid crystal material 40 is filled between the both substrates, and sealed. Thereafter, by forming a polarization plate (not shown) on the TFT substrate 11 and the CF substrate 9, the LCD panel as shown in FIG. 6 is obtained.

An electrically conductive resin 6 such as an anisotropic conductive film (ACF) is glued so as to fully cover the contact holes 10C and 10D. Subsequently, driver IC 7 is heated to about 250° C., and thereafter the driver IC 7 is mounted on the conductive resin 6 to be fixed thereto. Thus, the liquid crystal module as shown in FIG. 6 is completed.

Figure 15:
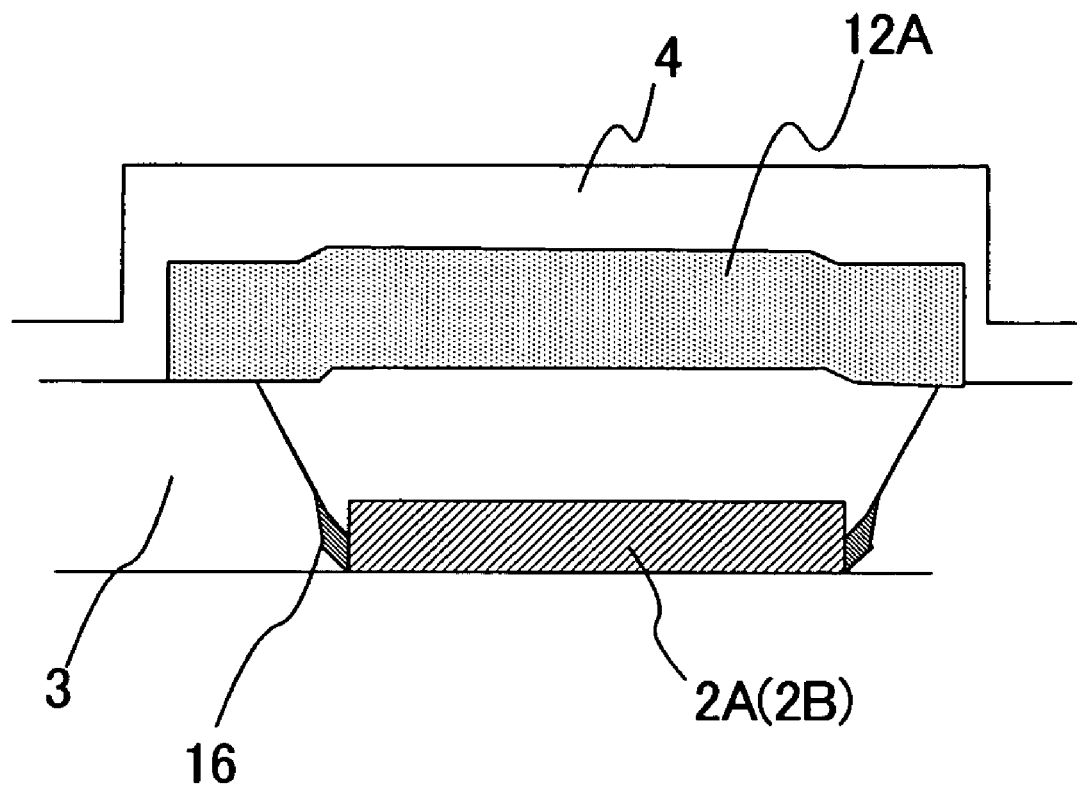
FIG. 15 is a section view for explaining effects of the TFT substrate of the present invention.

In the TFT substrate of the present invention, the voids do not occur in the first interlayer insulating film 3, and does not spread to the second interlayer insulating film 4, as shown in FIG. 15. Therefore, the voids are never exposed to the outside. As a result, hydration of the extraction wirings 2A and 2B does not occur, and the wiring disconnection never occurs. Thus, it is possible to obtain a TFT substrate with high reliability. In the conventional TFT substrate, when a test in which the conventional TFT substrate is driven at humidity of 80% and at a temperature of 60° C. is performed, the wiring disconnection occurs after passage of time of 200 hours. In the TFT substrate of the present invention, it is proved that the wiring disconnection does not occur even after 1000 hours.

While this invention has been described in connection with certain preferred embodiments, it is to be understood that the subject matter encompassed by way that of this invention is not limited to those specific embodiments. On the contrary, it is intended for the subject matter of the invention to include all alternative, modification and equivalents as can be included within the spirit and scope of the following claims.

What is claimed is:

1. An active matrix substrate, comprising:
   a transparent insulating substrate;
   a switching element formed on the transparent insulating substrate;
   a scanning line extraction wiring and a signal line extraction wiring attached to the switching element, each of the extraction wirings extending onto a same side of the transparent insulating substrate and having a terminal portion in a tip end thereof that is distal from the switching element, such that the terminal portions are arranged to be located on an elongated region extending along one peripheral end of the side of the transparent insulating substrate;
   a first interlayer insulating film formed on the transparent insulating substrate to cover the scanning line extraction wiring and the signal line extraction wiring;
   a contact hole penetrating through the first interlayer insulating film and being formed on each of the terminal portion of the scanning line extraction wiring and the signal line extraction wiring, the contact hole being used for connecting a driving device for driving a scanning line and a signal line of the switching element; and
   a semiconductor film pattern, serving as a moisture barrier, formed on the first interlayer insulating film, the semiconductor film pattern covering the scanning line extraction wiring and the signal line extraction wiring in the vicinity of the terminal portion thereof, the semiconductor film pattern comprising a same layer used to form a semiconductor layer of the switching element.

2. The active matrix substrate according to claim 1, wherein the transparent insulating substrate comprises one selected from among a glass substrate, a plastic substrate, and a substrate obtained by adhering the glass substrate and the plastic substrate.

3. The active matrix substrate according to claim 1, wherein the semiconductor film comprises an independent pattern covering the extraction wirings.

4. The active matrix substrate according to claim 1, wherein the semiconductor film comprises a linear pattern crossing all of the extraction wirings.

5. The active matrix substrate according to claim 1, wherein the semiconductor film is patterned simultaneously with a formation of a semiconductor layer of a thin film transistor comprising the switching element.

6. The active matrix substrate according to claim 1, wherein the semiconductor film comprises amorphous silicon.

7. The active matrix substrate according to claim 1, wherein the switching element is formed by a channel etching type process.

8. The active matrix substrate according to claim 1, further comprising a conductive resin disposed between the driving device and the scanning line extraction wiring and the signal line extraction wiring, and the semiconductor film pattern serves protects against moisture absorbed in the conductive resin.

9. The active matrix substrate according to claim 1, wherein the semiconductor film overlaps the scanning line extraction wiring and the signal line extraction wiring.

10. The active matrix substrate according to claim 1, wherein the driving device is disposed in the contact holes.

11. The active matrix substrate according to claim 1, wherein the driving device comprises a single driver integrated circuit that drives both the scanning line and the signal line of the switching element.

12. The active matrix substrate according to claim 1, wherein the switching element comprises one of a plurality of switching elements, each switching element of the plurality of switching elements having corresponding scanning line extraction wirings and a signal line extraction wirings and corresponding terminal portions, and all scanning line extraction wirings and all signal line extraction wirings of all the switches of the plurality of switching elements extend to the same side and the terminal portions of all the switching elements of the plurality of switching elements are located in the elongated region on the peripheral end of the side of the transparent insulating substrate.

13. The active matrix substrate according to claim 12, wherein the driving device comprises a single driver integrated circuit that drives both the scanning lines and the signal lines of all the switching elements.

14. The active matrix substrate according to claim 1, wherein the contact holes include a transparent conductive oxide film.

15. The active matrix substrate according to claim 14, further comprising a conductive resin disposed between the driving device and the transparent conductive oxide film.

16. The active matrix substrate according to claim 8, wherein the conductive resin covers an area larger than the driving device.

17. The active matrix substrate according to claim 1, further comprising a second insulating film covering the semiconductor film pattern and the first insulating film, wherein the contact hole penetrates through the first insulating film and the second insulating film.

18. The active matrix substrate according to claim 17, wherein the semiconductor film protrudes beyond a side edge of the scanning line extraction wiring and the signal line extraction wiring by an amount such that a crack through the first interlayer insulating film does not propagate into the second insulating film because the semiconductor film interrupts the crack.

19. The active matrix substrate according to claim 18, wherein the semiconductor film protrudes beyond the side edge by an amount based on a thickness of the first interlayer insulating film.

20. The active matrix substrate according to claim 19, wherein the semiconductor film protrudes beyond the side edge by approximately 2.5 μm.

* * * * *